United States Patent
Ziad et al.

(10) Patent No.: US 9,245,736 B2
(45) Date of Patent: Jan. 26, 2016

(54) PROCESS OF FORMING A SEMICONDUCTOR WAFER

(71) Applicant: Semiconductor Components Industries, LLC, Phoenix, AZ (US)

(72) Inventors: Hocine Bouzid Ziad, Kortrijk (BE); Peter Moens, Zottegem (BE); Eddy De Backer, Merelbeke (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/202,773

(22) Filed: Mar. 10, 2014

(65) Prior Publication Data
US 2014/0264368 A1 Sep. 18, 2014

Related U.S. Application Data

(60) Provisional application No. 61/786,605, filed on Mar. 15, 2013.

(51) Int. Cl.
*H01L 21/02* (2006.01)
*H01L 23/00* (2006.01)
(Continued)

(52) U.S. Cl.
CPC ...... *H01L 21/02021* (2013.01); *H01L 21/0242* (2013.01); *H01L 21/0254* (2013.01); *H01L 21/02087* (2013.01); *H01L 21/02381* (2013.01); *H01L 21/02595* (2013.01); *H01L 21/02598* (2013.01); *H01L 21/02639* (2013.01); *H01L 23/562* (2013.01); *H01L 29/2003* (2013.01);
(Continued)

(58) Field of Classification Search
None
See application file for complete search history.

(56) References Cited

U.S. PATENT DOCUMENTS

| | | | | |
|---|---|---|---|---|
| 5,863,829 | A | * | 1/1999 | Nakayoshi et al. ............ 438/459 |
| 8,772,177 | B2 | * | 7/2014 | Masuda .......................... 438/759 |

(Continued)

FOREIGN PATENT DOCUMENTS

| | | | |
|---|---|---|---|
| JP | 2009256154 A | * | 11/2009 |
| WO | WO 2011077661 A1 | * | 6/2011 |
| WO | 2011161975 A1 | | 12/2011 |

OTHER PUBLICATIONS

Frensly, et. al., "Reactive Ion Etching Tool and Wafer Etching", University of Texas at Dallas Erik Johnson School of Engineering, Dec. 3, 2003, pp. 1-9.*

(Continued)

*Primary Examiner* — Matthew Reames
*Assistant Examiner* — Vincent Wall
(74) *Attorney, Agent, or Firm* — Abel Law Group, LLP (57) ABSTRACT

A semiconductor wafer can include a substrate, a poly template layer, and a semiconductor layer. The substrate has a central region and an edge region, the poly template layer is disposed along a peripheral edge of the substrate, and a semiconductor layer over the central region, wherein the semiconductor layer is monocrystalline. In an embodiment, the poly template layer and the monocrystalline layer are laterally spaced apart from each other by an intermediate region. In another embodiment, the semiconductor layer can include aluminum. A process of forming the substrate can include forming a patterned poly template layer within the edge region and forming a semiconductor layer over the primary surface. Another process of forming the substrate can include forming a semiconductor layer over the primary surface and removing a portion of the semiconductor layer so that the semiconductor layer is spaced apart from an edge of the substrate.

20 Claims, 5 Drawing Sheets

(51) Int. Cl.
*H01L 29/20* (2006.01)
*H01L 29/51* (2006.01)
*H01L 29/66* (2006.01)
*H01L 29/778* (2006.01)

(52) U.S. Cl.
CPC ........ *H01L 29/513* (2013.01); *H01L 29/66462* (2013.01); *H01L 29/7783* (2013.01); *H01L 21/02433* (2013.01); *H01L 29/7787* (2013.01); *H01L 2924/0002* (2013.01)

(56) References Cited

U.S. PATENT DOCUMENTS

| | | | |
|---|---|---|---|
| 2002/0009878 A1* | 1/2002 | Takewaki et al. | 438/637 |
| 2003/0020092 A1* | 1/2003 | Parikh et al. | 257/192 |
| 2005/0161704 A1* | 7/2005 | Hoshi et al. | 257/192 |
| 2006/0138457 A1* | 6/2006 | Otsuka et al. | 257/194 |
| 2009/0148985 A1 | 6/2009 | Heying et al. | |
| 2011/0049526 A1 | 3/2011 | Chu et al. | |
| 2011/0139757 A1* | 6/2011 | Millman et al. | 219/121.69 |
| 2012/0034768 A1* | 2/2012 | Sato | 438/503 |
| 2012/0058623 A1* | 3/2012 | Hsieh | 438/459 |
| 2013/0087807 A1* | 4/2013 | Ikuta et al. | 257/76 |

OTHER PUBLICATIONS

A. Banerjee et al., U.S. Appl. No. 14/190,839, filed Feb. 26, 2014.
Extended European Search Report for EP Application No. 14159903.5, dated Jun. 3, 2014, 10 pages.
M. Van Hove, "CMOS Process-Compatible High-Power Low-Leakage AlGaN/GaN MISHEMT on Silicon", IEEE Electron Device Letters, vol. 33, pp. 667-669, 2012.
K. Donghyun, "Recessed 70-nm Gate-Length AlGaN/GaN HEMTs Fabricated Using an Al2O3/SiNx Dielectric Layer", IEEE Electron Device Letters, vol. 30, pp. 913-915, 2009.

* cited by examiner

PROCESS OF FORMING A SEMICONDUCTOR WAFER

CROSS-REFERENCE TO RELATED APPLICATION

This application claims priority under 35 U.S.C. §119(e) to U.S. Patent Application No. 61/786,605 entitled "Semiconductor Wafer," by Ziad et al., filed Mar. 15, 2013, which is assigned to the current assignee hereof and incorporated herein by reference in its entirety.

FIELD OF THE DISCLOSURE

The present disclosure relates to semiconductor wafers and processes of forming semiconductor wafers.

RELATED ART

Semiconductor devices are typically formed from a monocrystalline semiconductor material. A high mobility electron transistor (HEMT) device can be formed by epitaxially growing a semiconductor layer including AlGaN and GaN layers over a silicon substrate. During the epitaxial growth, cracks in the semiconductor layer may form and propagate from an edge toward a center of the substrate. Cracks can propagate a significant distance within the semiconductor layer towards the center significantly impacting yield.

Selective epitaxial growth has been suggested. Selective epitaxy is not a viable option for more complex semiconductor compositions or semiconductor layers that include aluminum, as selectivity may not be sufficient, the crystal may have too many defects, or the like. A need exists to form high quality monocrystalline semiconductor layers that are formed over a substrate having a different composition.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

Group numbers corresponding to columns within the Periodic Table of Elements based on the IUPAC Periodic Table of Elements, version dated Jan. 21, 2011.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A semiconductor wafer can include providing a substrate having a primary surface that has a central region and an edge region and a monocrystalline layer over the central region and not over the edge region. In an embodiment, the semiconductor wafer can include a poly template layer over the edge region, and the monocrystalline layer may not be over the poly template layer. In another embodiment, the poly template layer and the monocrystalline layer are spaced apart from each other by an intermediate region disposed between the central and edge regions. In a further embodiment, the monocrystalline layer can be part of a larger semiconductor layer that extends over the poly template layer and to the edge of the substrate. The portion of the semiconductor layer overlying the poly template layer may or may not remain over the poly template layer. In another embodiment, the monocrystalline layer includes aluminum, wherein none of the monocrystalline layer overlies the edge region. In yet another embodiment, a semiconductor wafer can include a substrate having a primary surface that has a central region and an edge region, and a monocrystalline layer overlying the central region and not overlying the edge region and in direct contact with and formed from a growth surface. Along any line perpendicular to the primary surface, no other layer above the growth surface is disposed between the monocrystalline layer and the substrate.

A process of forming a semiconductor wafer can include a substrate having a primary surface that includes a central region and an edge region, and forming a patterned poly template layer over the primary surface within the edge region. The process can further include forming a semiconductor layer over the primary surface within the central region and the edge region, wherein the semiconductor layer is monocrystalline within the central region and polycrystalline within the edge region. In an embodiment, the process can still further include removing a portion of the semiconductor layer over the edge region, wherein a remaining portion of the semiconductor layer is monocrystalline and lies within the central region.

As will be described in more detail below, the process and resulting semiconductor wafer are well suited to the formation of a complex, such as a III-V or II-VI semiconductor layer over a substrate having a different composition. When a poly template layer is used, a poly template layer formed within the edge region can help to reduce stress and allow a polycrystalline portion of an epitaxial layer to form formed and removed from the edge region to reduce the likelihood that a significant number of cracks would form and extend into the monocrystalline portion of the epitaxial layer. Thus, the crystalline quality of the semiconductor layer is improved and yield is improved. In another embodiment, a poly template layer is not used, and the epitaxially layer is grown directly from a growth surface. A portion of the epitaxial layer can be removed from over the edge region of the substrate, so that most crystalline defects in the epitaxial layer are removed, thus, reducing the likelihood that a significant number of crack will subsequently propagate toward the center of the wafer.

Figure 1:
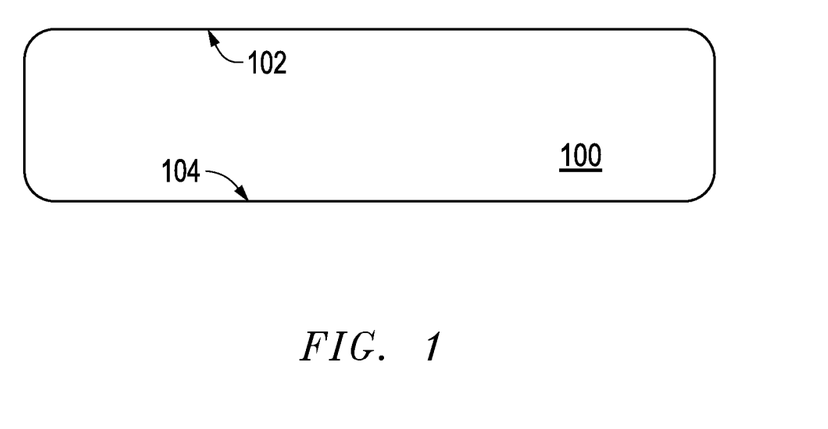
FIG. 1 includes an illustration of a cross-sectional view of a substrate.

FIG. 1 includes an illustration of a cross-sectional view of a portion of a substrate 100 that has a primary surface 102 and another primary surface 104 opposite the primary surface 102. The substrate 100 can include silicon, sapphire, spinel, another suitable substantially monocrystalline material, or the like. The selection of the particular material and crystal orientation along the primary surface 102 can be selected depending upon the composition of the semiconductor layer that will be subsequently formed over the substrate 100.

Figure 2:
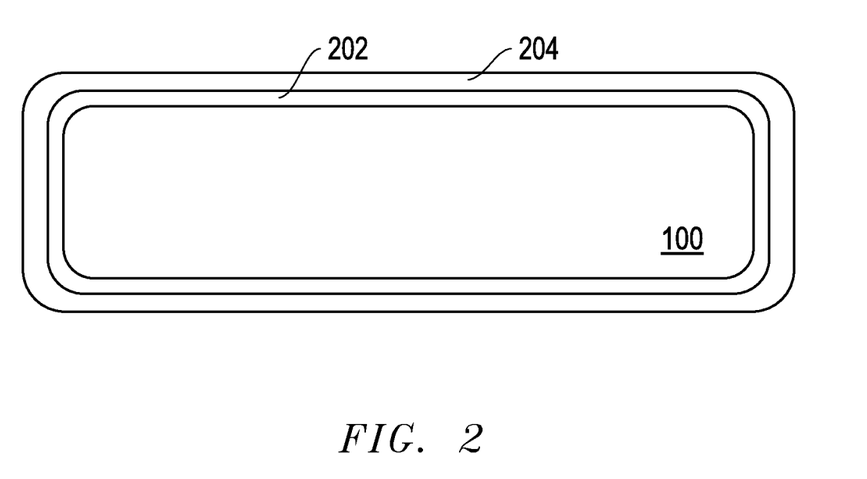
FIG. 2 includes an illustration of a cross-sectional view of the substrate of FIG. 1 after forming a poly template layer.

FIG. 2 includes an illustration of a cross-sectional view of a portion of the substrate 100 after forming a poly template layer. The poly template layer helps to form a polycrystalline portion of a subsequently-formed semiconductor layer. In an embodiment, the poly template layer includes a pad layer 202 and a template layer 204. The pad layer 202 can include an oxide and, in a more particular embodiment, includes a thermally grown silicon dioxide layer. The pad layer 202 can have a thickness in a range of 5 nm to 50 nm. The template layer 204 can include silicon nitride, and in a particular embodiment, can have a thickness in a range of 20 nm to 200 nm. The template layer 204 can be formed using a chemical or physical vapor deposition technique. In another embodiment, the poly template layer may include only an oxide layer having a thickness in a range of 25 nm to 250 nm.

Figure 3:
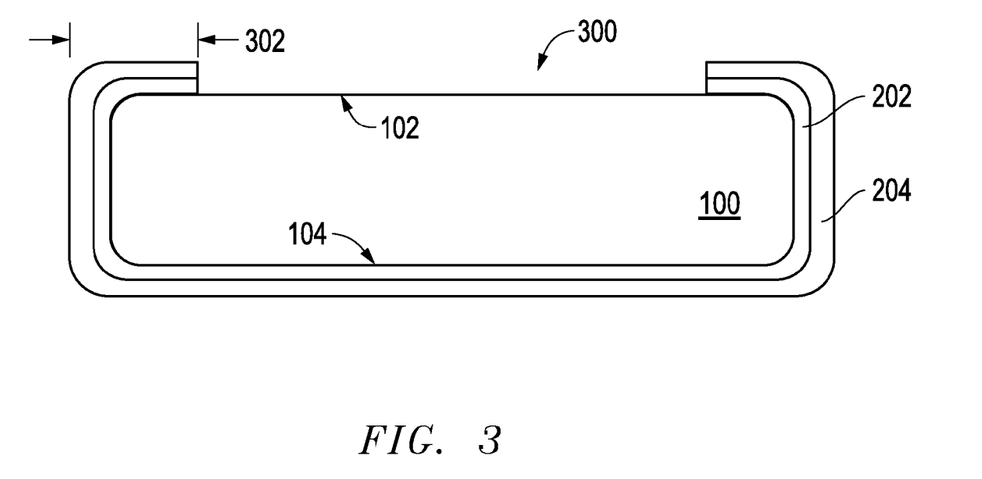
FIG. 3 includes an illustration of a cross-sectional view of the substrate of FIG. 1 after patterning the poly template layer to define an opening through the poly template layer.

FIG. 3 includes an illustration of a cross-sectional view of the substrate 100 after forming an opening 300 extending through the pad layer 202 and the template layer 204. As illustrated in the embodiment of FIG. 3, the template layer 204 overlies an edge portion of the substrate 100 as well as the along the sides and along the other primary surface 104 of the substrate 100. The patterning can be formed using a dry etch process, a wet etch process, or a combination of wet and dry etch processes. In an embodiment, the edge region 302 may extend no greater than 9 mm, 7 mm, 5 mm, or 3 mm from the peripheral edge of the substrate 100. In another embodiment, the edge region 302 is at least 0.2 mm, at least 0.5 mm, or at least 1.1 mm.

Figure 4:
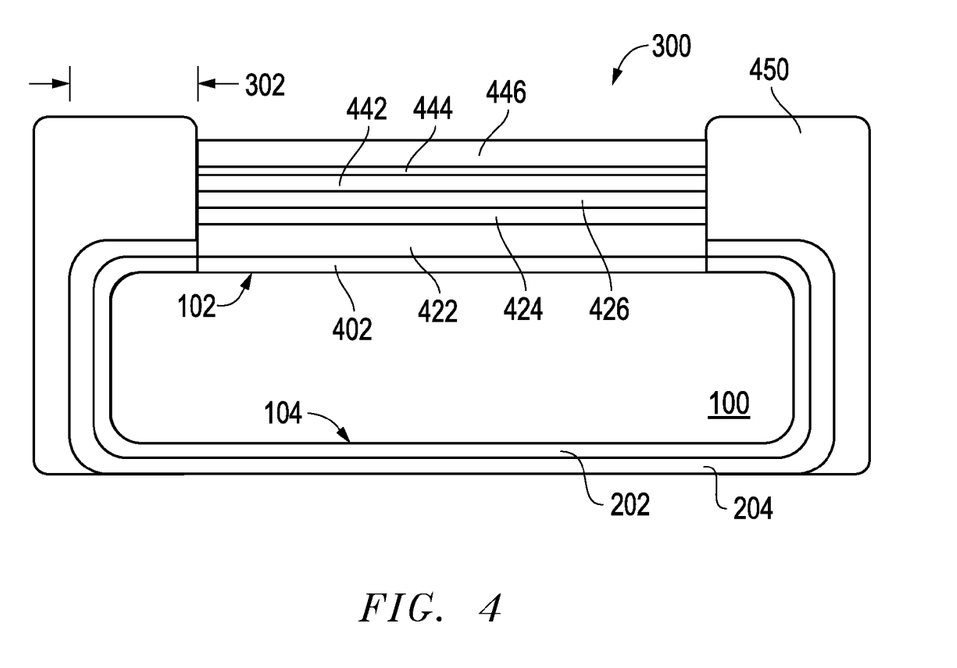
FIG. 4 includes an illustration of a cross-sectional view of the substrate of FIG. 3 after forming a plurality of layers over the substrate and a portion of the poly template layer.

FIG. 4 includes an illustration of a cross-sectional view of the substrate 100 after forming a nucleation layer 402, a semiconductor layer, and a gate dielectric layer. The nucleation layer 402 can help to epitaxially grow the semiconductor layer. In an embodiment, the nucleation layer 402 may include one or more elements that are common to the subsequently formed semiconductor layer. In a particular embodiment, the nucleation layer can include aluminum nitride when an aluminum-containing semiconductor layer is being formed over the nucleation layer 402. The thickness of the nucleating layer can be in a range of 50 nm to 500 nm.

The semiconductor layer can include a buffer film 422, a channel film 424, a barrier film 426, and a polycrystalline portion along the poly template layer. The composition of the buffer film 422 may depend on the composition of the channel film 424. In an embodiment, the channel film includes GaN, and the buffer film 422 includes AlGaN. The composition of the buffer film 422 can be changed as a function of thickness, such that the buffer film 422 has a greater aluminum content closer to the nucleation layer 402 and relatively greater gallium content closer to the channel film 424. In a particular embodiment, the cation (metal atoms) content near the nucleation layer 204 can be 70% to 95% Al with the remainder Ga, and the cation content near the channel film 424 can be 5% to 25% Al with the remainder Ga. The buffer film 422 can have a thickness in a range of 1 micron to 5 microns. In another embodiment, the buffer film can include a superlattice structure alternating GaN and AlN, each having a thickness in a range 3 nm to 30 nm.

The channel film 424 can include GaN and have a thickness in a range of 50 nm to 400 nm. The barrier film 426 confines the 2-dimensional electron gas at the interface between the barrier film 426 and the channel film 424. In a particular embodiment, the barrier film 426 can include AlGaN, wherein the cation content is 10 to 40% aluminum with the remainder gallium. The barrier film 426 can have a thickness in a range of 5 nm to 25 nm. In another embodiment, the barrier film 426 can include AlN with a thickness in a range 5 nm to 25 nm. In a further embodiment, the barrier film 426 can include InAlGaN with a thickness in a range 5 nm to 50 nm. In yet another embodiment, the barrier film 426 can include InAlN with a thickness in a range 5 nm to 50 nm.

The semiconductor layer is formed using an epitaxial growth technique. In a particular embodiment, metal-containing films can be formed using metalorganic chemical vapor deposition. The semiconductor layer includes a monocrystalline portion within and over the opening 300 in the poly template layer and a polycrystalline portion along the poly template layer. Cracks may form in the semiconductor layer near the perimeter of the substrate 100. The poly template layer within the edge region 302 helps to allow the cracks and other defects to propagate in a variety directions, rather than preferentially along a crystal plane. Thus, cracks are more likely to terminate within the edge region 302 than extend into the central region. The significance of the cracks and their location is addressed later in this specification.

A gate dielectric layer can include nitride films 442 and 444. The nitride film 442 can include silicon nitride and have a thickness in a range of 5 nm to 40 nm, and the nitride film 444 can include aluminum nitride film and have a thickness in a range of 2 nm to 20 nm. In another embodiment, the gate dielectric layer can include fewer or more films that may have the same or different compositions as described. For example, the nitride films 442 and 444 may be replaced by a single film of silicon nitride. Alternatively, an aluminum oxide film may be formed over the nitride film 444. The nitride film 446 can be used to protect the gate dielectric layer. The nitride film 446 can include silicon nitride and have a thickness in a range of 20 nm to 200 nm. The gate dielectric layer and the nitride film 446 can be formed using a chemical or physical vapor technique.

In an embodiment, the semiconductor layer, the gate dielectric layer, and the nitride film 446 are formed without exposing the workpiece to air or another oxygen-containing gas. Thus, the layers and films can be formed without an oxide at an interface between any of the layers and films. In another embodiment, the workpiece may be exposed to air between forming any one or more of the films or layers. If an interfacial oxide is not to remain in the finished device, the interfacial oxide may be reduced in a reducing ambient or etched, for example, back sputtering, to remove the interfacial oxide before forming the subsequent layer or form. In still another embodiment, an oxide film may be formed and remain. For example, after forming the gate dielectric layer, the workpiece may be exposed to air before forming the nitride film 446. Referring to FIG. 4, the combination of the semiconductor layer, the gate dielectric layer, and nitride film 446 is illustrated as the poly growth region 450 that lies along the poly template layer within the edge region.

In another embodiment, a p-type doped GaN layer ("p-GaN") may be inserted between the barrier layer 426 and the nitride film 446. In this particular embodiment, the gate dielectric layer, including films 442 and 444, is not necessary. The p-GaN layer can be heavily doped with a p-type dopant, such as Mg, with concentrations in excess of $10^{19}$ atoms/cm$^3$, and have a thickness in a range 30 nm to 100 nm.

Figure 5:
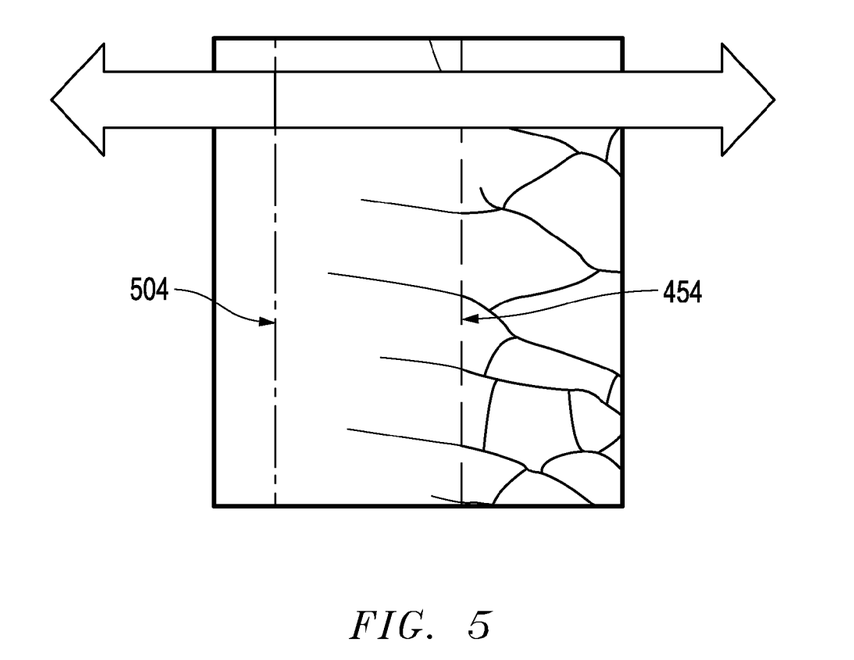
FIG. 5 includes a scanning electron microscope image of a workpiece after forming at least some of the layers as illustrated in FIG. 4.

FIG. 5 includes a scanning electron microscope image to illustrate positional relationships between different regions after forming the semiconductor layer, the gate dielectric layer, and the nitride film 446. The poly growth region 450 is to the right of the dashed line 454 and has a relatively rough surface. Some cracks within the poly growth region 450 may extend past the dashed line 454 but none of the cracks extend to the dash-dot line 504. A subsequently-formed resist member will be formed at or to the left of the dash-dot line 504. Thus, during a subsequent etching operation, all of the cracked material will be removed.

Figure 6:
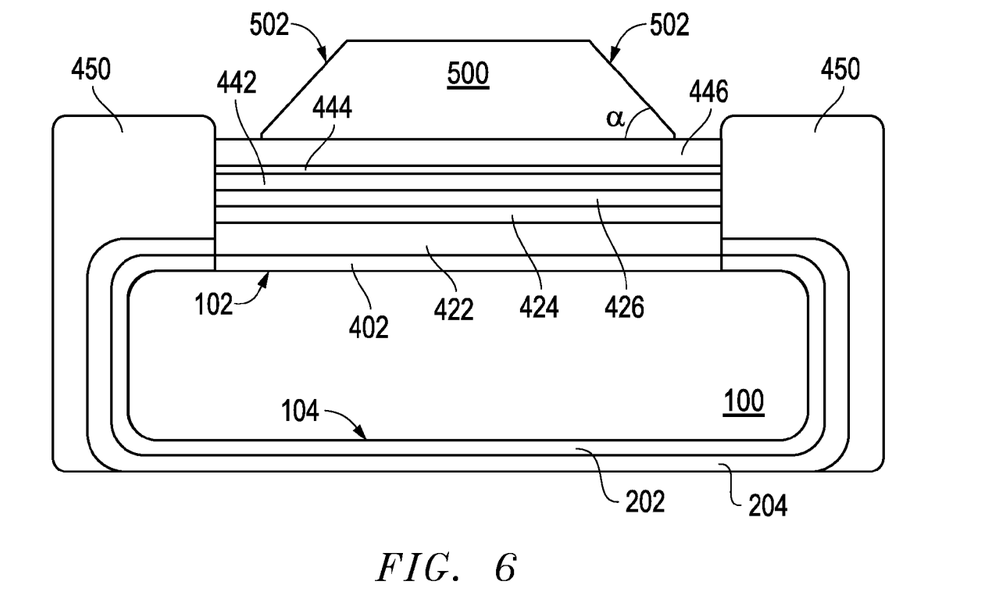
FIG. 6 includes an illustration of a cross-sectional view of the substrate of FIG. 4 after forming a resist member.

A patterned resist mask is formed and includes a resist member 500 that covers a portion of the nucleation layer 402, the semiconductor layer, the gate dielectric layer, and the nitride film 446, as illustrated in FIG. 6. The resist member 500 overlies a central region of the substrate and represents where portions of the underlying layers will remain after a patterning step. In a particular embodiment, the resist member 500 has a sloped sidewall 502 that lies along a plane that intersects the primary surface 102 of the substrate 100 at an angle alpha ($\alpha$). The angle $\alpha$ is in a range of 30° to 70°. The slope helps to prevent an uncontrolled accumulation of etch residue at the edge of the monocrystalline region to reduce defectivity.

Figure 7:
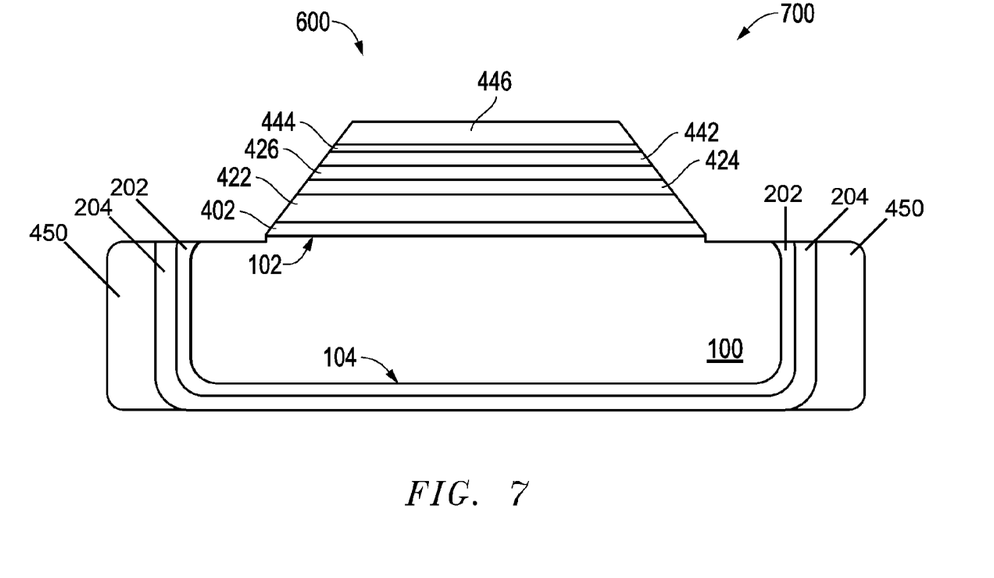
FIG. 7 includes an illustration of a cross-sectional view of the substrate of FIG. 6 after forming etching the plurality of layers within the edge region and removing the resist member.

Exposed portions of the semiconductor layer, gate dielectric layer, nitride film 446, and poly growth region 450 are etched to form the structure 600 of the semiconductor wafer 700, as illustrated in FIG. 7. The etching can be performed using a chlorine-containing gas, such as $Cl_2$, $BCl_3$, HCl, or the like using reactive ion etching. A portion of the resist member 500 may be eroded during the etch so that the structure 600 has a sloped sidewall similar to the resist member 500. In a particular embodiment, the sloped sidewall of the structure 600 lies along a plane that intersects the primary surface 102 of the substrate 100 at an angle that is no greater than 30°, and in another embodiment is no greater than 9°, or no greater than 1°.

During the etch, the poly grown region 450 within the edge region is removed. In a particular embodiment, portions of the semiconductor layer, gate dielectric layer, and the nitride film 446 that lie within the opening 300 (as illustrated in FIG. 4) and inside of the edge region may also be removed. The etching can be performed as a timed etch, using endpoint detection, or a combination of endpoint detection along with a timed overetch. Depending on the etch chemistry and composition of the template layer 204 and the pad layer 202, the template layer 204, the pad layer 202, or both may or may not be etched. After the etch is completed the resist member 500 is removed to provide the workpiece 700 as illustrated in FIG. 7.

Figure 8:
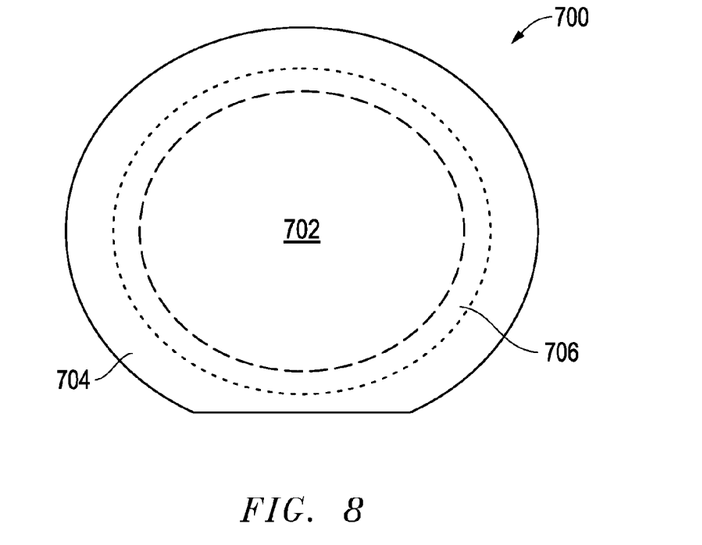
FIG. 8 includes an illustration of a top view of a semiconductor wafer of FIG. 7 to illustrate positional relationships between a central region, an edge region, and an intermediate region.

FIG. 8 includes an illustration of a top view of the semiconductor wafer 700 that includes an edge region 704 that is the portion between an outer perimeter of the semiconductor wafer 700 and where the poly template layer terminated, which in FIG. 8 is illustrated with a set of dots. The central region 702 includes the portion of the semiconductor wafer 700 where the structure 600 (FIG. 7) is located. The central region 702 and the edge region 704 are separated by an intermediate region 706 that corresponds to the region between the structure 600 and the poly template layer 204. Thus, the central region 702 is further from the outer perimeter of the semiconductor wafer 700 as compared to the edge region 704 and the intermediate region 706. In an embodiment, the edge region 704, the intermediate region 706, or each of the edge and intermediate regions 704 and 706 has a width no greater than 9 mm, 7 mm, 5 mm, or 3 mm from the peripheral edge of the substrate 100. In another embodiment, the width is at least 0.2 mm, at least 0.5 mm, or at least 1.1 mm.

In another embodiment, the patterning operation to remove the poly growth region 450 does not need to be performed, and thus the semiconductor wafer as illustrated in FIG. 4 may be produced. As illustrated in FIG. 5, the underlying poly template layer can help cracks or defects to form in more random directions within the poly growth region, as opposed to preferentially along particular crystal directions. Thus, cracks can have a greater likelihood of terminating before reaching the central region of the wafer.

Figure 9:
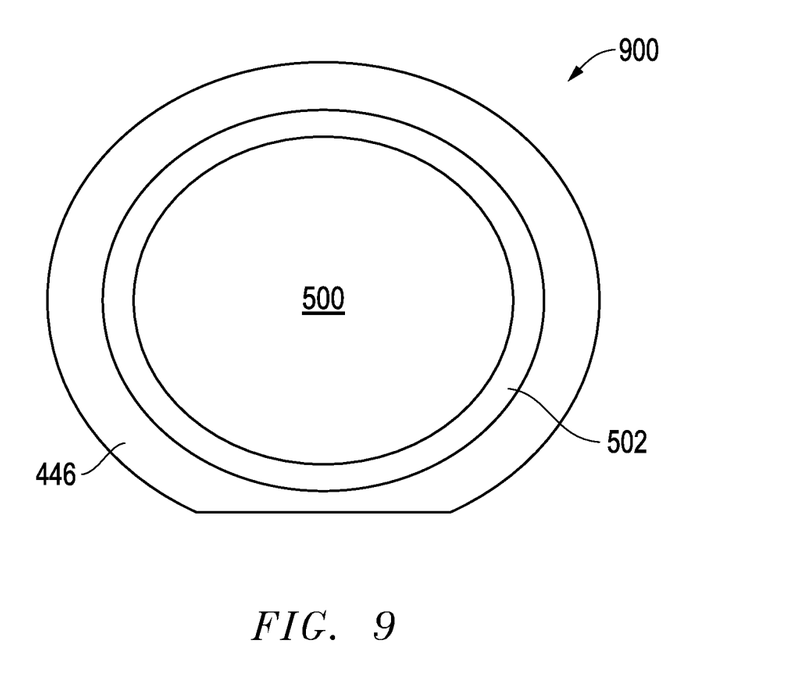
FIG. 9 includes an illustration of a top view of a semiconductor wafer after forming layers and a resist member over a substrate to illustrate positional relationships between such features and an edge of the semiconductor wafer.
Figure 10:
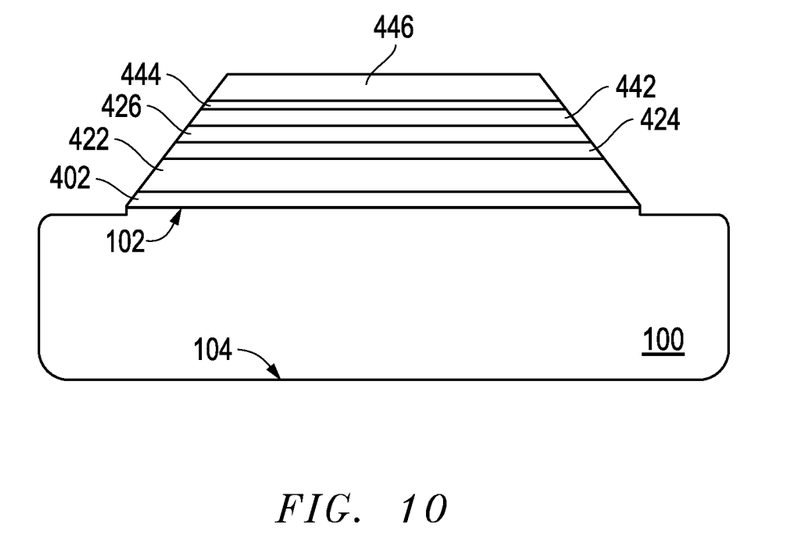
FIG. 10 includes an illustration of a cross-sectional view of the substrate of FIG. 9 after forming etching the plurality of layers within the edge region and removing the resist member.

In still another embodiment, a poly template layer is not used. Thus, pad layer 202 and the template layer 204 are not formed. The nucleation layer 402, the semiconductor layer (including films 422, 424, and 426), the gate dielectric layer (including films 442 and 444), and the nitride film 446 can be formed as previously described. Because the poly template layer is not present, the layers are formed to the edge of the substrate, and the poly growth region 450 is not formed. The monocrystalline layers may have many defects and exhibit polycrystallinity over the edge region of the substrate 100. The resist member 500 is formed over the nitride film 446 of wafer 900, as illustrated in FIG. 9. The resist member 500 has the slope 502 as previously described. Exposed portions of the layers and films overlying the substrate 100 are removed as previously described, and the resist member 500 is subsequently removed. FIG. 10 includes an illustration of the semiconductor wafer at this point in the process. The semiconductor wafer as illustrated in FIG. 10 is similar to the semiconductor wafer as illustrated in FIG. 7 except that remaining portions of the poly growth layer 450 and the poly template layer, including films 202 and 204, are not present.

For any of the previously described embodiments, additional processing is performed to form a substantially completed device. Such processing can include forming source and drain electrodes extending through the gate dielectric layer and the nitride film 446, forming a gate electrode in direct contact with the gate dielectric layer, forming insulating layers that can extend to the edge of the semiconductor wafer, forming interconnects, forming a passivation layer, perform another suitable operation, or any combination thereof.

Embodiments as described herein can provide benefits in forming a semiconductor layer that is less likely to have stress-induced cracks in a finished device. The poly template layer within the edge region helps to allow the cracks and other defects in the overlying semiconductor layer to propagate in different directions, and not along particular crystal planes because the semiconductor layer is polycrystalline over the poly template layer. Thus, cracks are more likely to terminate within the region over the poly template layer and than extending a substantial distance into the central region. The resist member 500 can be formed so that cracks that extend into a monocrystalline portion of the semiconductor layer are removed with the polycrystalline portion. Thus, the semiconductor wafer has a semiconductor layer of substantially higher quality and a reduced likelihood that stress induced cracks will extend into monocrystalline portion of the semiconductor layer that remains in the finished device. Therefore, the device characteristics and yield be higher for the semiconductor wafer 700 as compared to a semiconductor wafer is formed using a conventional.

The process does not require a selective epitaxial growth technique. Selective epitaxial growth may not be possible for some elements that are more likely to adhere to a variety of materials, such as aluminum. Other III-V and II-VI materials may also have problems with selective epitaxy. As a semiconductor layer includes more different elements, the likelihood of being able to perform selective epitaxial growth may be difficult to control or may result in reduced or widely varying yield. Thus the process as described which does not require selective epitaxy can be used and still achieve good device characteristics and yield.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. A semiconductor wafer can include:
a substrate having a primary surface that has a central region, an edge region, an intermediate region disposed between the central region and the edge region;
a poly template layer disposed along a peripheral edge of the substrate: and
a semiconductor layer over the central region, wherein the semiconductor layer is monocrystalline;
wherein the poly template layer and the monocrystalline layer are laterally spaced apart from each other by the intermediate region.

Item 2. A process of forming a semiconductor wafer can include:
providing a substrate having a primary surface that includes a central region and an edge region;
forming a patterned poly template layer over the primary surface within the edge region; and
forming a semiconductor layer over the primary surface within the central region and the edge region, wherein the semiconductor layer is monocrystalline within the central region and polycrystalline within the edge region.

Item 3. The process of Item 2, wherein forming the patterned poly template layer includes:
forming a poly template layer over the primary surface within the central and edge regions; and
etching a portion of the poly template layer within the central region to define the edge region, wherein after etching, none of the poly template layer lies within the central region, and wherein etching the portion of the poly template layer is performed before forming the semiconductor layer.

Item 4. The process of Item 2 or 3, further comprising removing a portion of the semiconductor layer over the edge region, wherein a remaining portion of the semiconductor layer is monocrystalline and lies within the central region.

Item 5. The process of any one of Items 2 to 4, wherein after removing the portion of the semiconductor layer, the portion of the semiconductor layer is laterally spaced apart from the poly template layer by an intermediate region that does not include any portion of each of the semiconductor layer and the poly template layer.

Item 6. The process of any one of Items 2 to 5, further including forming a gate dielectric layer over the semiconductor layer.

Item 7. The process of any one of Items 2 to 6, further including:
forming a patterned resist layer over the gate dielectric layer and within the central region, wherein the patterned resist layer has a sloped edge that lies along a plane that intersects the primary surface at an angle no greater than 30°; and
removing a portion of the gate dielectric layer and the portion of the semiconductor layer is performed while the pattered resist layer overlies the gate dielectric layer.

Item 8. The semiconductor wafer or the process of any one of the preceding Items, wherein the semiconductor layer includes a GaN film.

Item 9. The semiconductor wafer or the process of any one of the preceding Items, wherein the semiconductor layer further includes a first AlGaN film.

Item 10. The semiconductor wafer or the process of any one of the preceding Items, wherein the semiconductor layer further includes a second AlGaN layer, wherein the GaN layer is disposed between the first and second AlGaN films.

Item 11. The semiconductor wafer or the process of any one of the preceding Items, further including an aluminum nitride layer disposed between the substrate and the first AlGaN layer.

Item 12. The semiconductor wafer or the process of any one of the preceding Items, wherein the intermediate region, the edge region or each of the intermediate and edge regions is no greater than 9 mm wide.

Item 13. The semiconductor wafer or the process of any one of the preceding Items, wherein the poly template layer includes an oxide film and a nitride film, and the oxide film is disposed between the substrate and the nitride film.

Item 14. The semiconductor wafer or the process of any one of the preceding Items, further including an AlN layer and a gate dielectric layer wherein:
the substrate is a monocrystalline silicon wafer;
the poly template layer includes a silicon dioxide film disposed along a peripheral edge of the substrate, and a silicon nitride film over the silicon dioxide film, and the poly template layer is spaced apart from the central region;
the AlN layer is disposed between the substrate and the semiconductor layer;
the semiconductor layer includes a buffer film over the AlN layer, a GaN film over the buffer film, and a barrier film over the GaN film; and
the gate dielectric layer overlies the barrier film and includes one or more nitride films.

Item 15. The semiconductor wafer or the process of Item 14, wherein the semiconductor layer and the gate dielectric layer are located only within the central region and define a sloped edge lies along a plane that intersects the primary surface at an angle no greater than 30°.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming a semiconductor wafer comprising:
providing a substrate having a primary surface and including a central region, an edge region including a side surface adjacent to the primary surface, and an intermediate region disposed between the central region and the edge region;
forming a patterned poly template layer over the primary surface within the edge region wherein the central region is not covered by the patterned poly template layer; and
forming a semiconductor layer over all of the primary surface and along the side surface, wherein the semiconductor layer is monocrystalline within the central region and polycrystalline where formed over the patterned poly template layer; and
removing a portion of the semiconductor layer from over the intermediate region, wherein after removing the part of the semiconductor layer:
a first remaining portion of the semiconductor layer is monocrystalline and lies within the central region,
a second remaining portion of the semiconductor layer is polycrystalline and lies along the side surface, and
the first remaining portion of the semiconductor layer is laterally spaced apart from the second remaining portion of the semiconductor layer, wherein the intermediate region is disposed between the first and second remaining portions of the semiconductor layer and does not include any portion of each of the semiconductor layer and the patterned poly template layer.

2. The process of claim 1, wherein forming the patterned poly template layer comprises:
forming a poly template layer over the primary surface within the central and edge regions; and
etching a portion of the poly template layer before forming the semiconductor layer, wherein after etching, none of the poly template layer lies within the central region.

3. The process of claim 1, wherein forming the semiconductor layer comprises forming a GaN film.

4. The process of claim 3, wherein forming the semiconductor layer comprises:
forming a buffer film over the primary surface of the substrate;
forming the GaN layer over the buffer layer; and
forming a barrier layer over the GaN layer,
wherein the buffer film, the barrier film, or each of the buffer film and the barrier film includes aluminum.

5. The process of claim 1, further comprising forming a gate dielectric layer over the semiconductor layer.

6. The process of claim 5, further comprising removing a portion of the gate dielectric layer such that the gate dielectric layer has a sloped edge.

7. The process of claim 5, further comprising: removing a portion of the gate dielectric layer from over the edge region, wherein:
a first remaining portion of the gate dielectric layer lies within the central region, and
after removing the portion of the gate dielectric layer, the first remaining portion of the gate dielectric layer is laterally spaced apart from the patterned poly template layer by the intermediate region that does not include any portion of the gate dielectric layer.

8. The process of claim 3, wherein forming the semiconductor layer further comprises forming a first AlGaN film.

9. The process of claim 8, wherein forming the semiconductor layer further comprises forming a second AlGaN film, wherein forming the GaN film is performed between forming the first AlGaN film and forming the second AlGaN film.

10. The process of claim 8, further comprising forming an aluminum nitride layer over the substrate and before forming the first AlGaN layer.

11. The process of claim 1, wherein removing the portion of the semiconductor layer over the intermediate region is performed such that the semiconductor layer within the first remaining portion has a sloped edge adjacent to the intermediate region.

12. The process of claim 11, wherein the sloped edge lies along a plane that intersects the primary surface at an angle no greater than 30°.

13. The process of claim 1, wherein the intermediate region, the edge region, or each of the intermediate and edge regions is no greater than 9 mm wide.

14. The process of claim 1, wherein forming the patterned poly template layer comprises:
    forming a pad layer; and
    forming a template layer after forming the pad layer.

15. The process of claim 14, wherein:
    forming the pad layer comprises thermally growing a silicon dioxide layer; and
    forming the template layer comprises forming a silicon nitride layer.

16. The process of claim 1, further comprising forming a resist member over the semiconductor layer before removing the portion of the semiconductor layer.

17. The process of claim 16, wherein the resist member has a sloped sidewall.

18. The process of claim 17, wherein removing the portion of the semiconductor layer is performed using reactive ion etching.

19. The process of claim 1, further comprising forming an AlN layer and forming a gate dielectric layer wherein:
    the substrate is a monocrystalline silicon wafer;
    the patterned poly template layer includes a silicon dioxide film disposed along a peripheral edge of the substrate, and a silicon nitride film over the silicon dioxide film, and the patterned poly template layer is spaced apart from the central region;
    the AlN layer is disposed between the substrate and the semiconductor layer;
    the semiconductor layer includes a buffer film over the AlN layer, a GaN film over the buffer film, and a barrier film over the GaN film; and
    the gate dielectric layer overlies the barrier film and includes one or more nitride films.

20. The process of claim 19, wherein the semiconductor layer and the gate dielectric layer are located only within the central region and define a sloped edge lying along a plane that intersects the primary surface at an angle no greater than 30°.

* * * * *